US008919997B2

(12) United States Patent
Im et al.

(10) Patent No.: US 8,919,997 B2
(45) Date of Patent: *Dec. 30, 2014

(54) WHITE LIGHT EMITTING DIODE AND LIQUID CRYSTAL DISPLAY INCLUDING THE SAME
(71) Applicant: Samsung Electronics Co., Ltd., Suwon-si, Gyeonggi-do (KR)
(72) Inventors: Seoung-Jae Im, Seoul (KR); Seo-Young Choi, Seoul (KR); Eun-Joo Jang, Suwon-si (KR)
(73) Assignee: Samsung Electronics Co., Ltd. (KR)
( * ) Notice: Subject to any disclaimer, the term of this patent is extended or adjusted under 35 U.S.C. 154(b) by 0 days.

This patent is subject to a terminal disclaimer.

(21) Appl. No.: 14/255,096
(22) Filed: Apr. 17, 2014
(65) Prior Publication Data
US 2014/0226105 A1 Aug. 14, 2014

Related U.S. Application Data
(63) Continuation of application No. 13/179,774, filed on Jul. 11, 2011, now Pat. No. 8,702,277.

(30) Foreign Application Priority Data

Jul. 12, 2010 (KR) ........................ 10-2010-0067095

(51) Int. Cl.
| | | |
|---|---|---|
| *H01L 33/50* | (2010.01) | |
| *G02F 1/1335* | (2006.01) | |
| *H01L 33/58* | (2010.01) | |
| *H01L 33/30* | (2010.01) | |
| *C09K 11/02* | (2006.01) | |
| *C09K 11/56* | (2006.01) | |
| *C09K 11/88* | (2006.01) | |
| *H01L 33/28* | (2010.01) | |
| *B82Y 20/00* | (2011.01) | |

(52) U.S. Cl.
CPC .............. *H01L 33/504* (2013.01); *C09K 11/02* (2013.01); *C09K 11/565* (2013.01); *C09K 11/883* (2013.01); *G02F 1/133603* (2013.01); *H01L 33/58* (2013.01); *G02F 1/133609* (2013.01); *H01L 33/28* (2013.01); *H01L 33/30* (2013.01); *H01L 33/502* (2013.01); *G02F 2001/133614* (2013.01); *Y02B 20/181* (2013.01); *B82Y 20/00* (2013.01); *Y10S 977/95* (2013.01)

USPC ................. 362/293; 349/62; 349/63; 349/69; 977/950

(58) Field of Classification Search
CPC .......... C09K 11/02; H01L 33/28; H01L 33/30
USPC .................................. 362/293; 349/62, 63, 69
See application file for complete search history.

(56) References Cited

U.S. PATENT DOCUMENTS

| | | |
|---|---|---|
| 6,501,091 B1 | 12/2002 | Bawendi et al. |
| 7,481,562 B2 | 1/2009 | Chua et al. |
| 2006/0081862 A1 | 4/2006 | Chua et al. |
| 2007/0085092 A1 | 4/2007 | Chen |
| 2008/0012031 A1 | 1/2008 | Jang et al. |
| 2008/0230795 A1 | 9/2008 | Dias |
| 2008/0246017 A1 | 10/2008 | Gillies et al. |
| 2009/0009057 A1 | 1/2009 | Lee et al. |
| 2009/0109435 A1 | 4/2009 | Kahen et al. |
| 2009/0180055 A1 | 7/2009 | Kim et al. |
| 2010/0123155 A1 | 5/2010 | Pickett et al. |

FOREIGN PATENT DOCUMENTS

| | | |
|---|---|---|
| JP | 2006114900 A | 4/2006 |
| JP | 2006513458 A | 4/2006 |
| JP | 2008235893 A | 10/2008 |
| KR | 1020040073068 A | 8/2004 |
| KR | 1020080006906 A | 1/2008 |
| KR | 10835059 B1 | 5/2008 |
| KR | 1020090078547 A | 7/2009 |
| WO | 2005017951 A2 | 2/2005 |

*Primary Examiner* — Elmito Breval
(74) *Attorney, Agent, or Firm* — Cantor Colburn LLP

(57) ABSTRACT

A white light emitting diode includes a blue light emitting diode ("LED") light source, and a light conversion layer which converts incident light from the blue LED light source into white light. The light conversion layer includes a green light emitting semiconductor nanocrystal and a red light emitting semiconductor nanocrystal. The white light emitting diode has a red, green and blue color ("RGB") color locus which is within a chrominance error range (±4ΔE*ab±2ΔE*ab) locus from the constant hue locus of each of sRGB color coordinates, or within a chrominance error range (±4ΔE*ab±2ΔE*ab) locus from the constant hue locus of each of AdobeRGB color coordinates.

38 Claims, 9 Drawing Sheets

US 8,919,997 B2

WHITE LIGHT EMITTING DIODE AND LIQUID CRYSTAL DISPLAY INCLUDING THE SAME

CROSS-REFERENCE TO RELATED APPLICATIONS

This application is a continuation application of U.S. application Ser. No. 13/179,774 filed Jul. 11, 2011, which claims priority to Korean Patent Application No. 10-2010-0067095 filed on Jul. 12, 2010, and all the benefits accruing therefrom under 35 U.S.C. §119, the entire contents of which is incorporated herein by reference.

BACKGROUND

1. Field

Provided is a white light emitting diode ("LED") and a liquid crystal display device including the same.

2. Description of the Related Art

A white light emitting diode using a semiconductor is in the spotlight as one of next generation light emitting devices that are capable of replacing existing light emitting devices, due to its long life-span, capability of being down-sized, low power consumption, and environmentally friendly characteristic of being mercury free. The white light emitting diode is also used for an instrument panel of automobiles, a backlight of liquid crystal displays ("LCDs"), and the like.

Particularly, for use as a backlight of a liquid crystal display, a method of using a tri-color (red, green, and blue, or "RGB") light emitting diode having excellent efficiency and color purity has been suggested, however it has a drawback of poor price competitiveness due to its high manufacturing cost and complicated operation circuit. Thus, there is a demand for the development of a one chip solution that can reduce manufacturing cost and simplify the construction of a device, while maintaining efficiency and color purity performance similar to the existing method.

As one of the one chip solutions, a white LED that combines an indium gallium nitride (InGaN) series blue light emitting diode having a wavelength of about 450 nanometers (nm) with a cerium-doped yttrium aluminum garnet (YAG:Ce) phosphor has been developed. The operation principle of the light emitting diode is that a part of blue light generated in the blue light emitting diode excites the YAG:Ce phosphor to generate a yellow-green color, and the blue and yellow-green colors are combined to emit white light.

However, since the white LED light combining the blue light emitting diode with the YAG:Ce phosphor has only a part of the spectrum of the visible ray region, it has a low color rendering index, and when passing through a red, green, or blue color filter, many light components fail to pass through the color filter thus causing efficiency loss. Thereby, it has low color purity and thus is not suitable for a display device requiring high definition such as a television ("TV").

A method of manufacturing a white light emitting diode using an ultraviolet ("UV") light emitting diode that is expected to have high energy efficiency as an excitation source rather than a blue light emitting diode, and using a blue, green, and red light emitting source, has been researched. However, it is required to develop a red light emitting source having high efficiency compared to blue and green.

As another method, a method of coating green and red inorganic phosphors on a blue light emitting diode has been attempted. However, a suitable material that is capable of exciting an inorganic phosphor that is excited by relatively high energy to a blue wavelength of the visible light region has not yet been developed, and a thus-far developed green phosphor has low stability and color purity. Further, a problem of low efficiency of a red phosphor has not yet been settled, and thus the method has a limitation in that color purity and light efficiency required in a light emitting diode for a backlight unit cannot be secured.

SUMMARY

In embodiments of white light emitting diode ("LED") richer colors may be realized by including a wider region of color space when a white color coordinate is adjusted in order to realize a white color. Standard red, green and blue ("sRGB") and Adobe RGB color coordinates have been widely used as the standard color space for high definition television ("HDTV") broadcast and multimedia applications. Particularly, the Adobe RGB color coordinate has been used as a standard for expressing colors of a relatively wide region in a display.

Provided is a white light emitting diode that effectively includes an Adobe RGB color space, and effectively provides gamut mapping of the color image information that is encoded and transferred by sRGB or Adobe RGB standards.

Provided is a liquid crystal display device that includes the white light emitting diode, and is capable of realizing a light color space.

Provided is a liquid crystal display device including a white light emitting diode, and a color filter realizing images using a white light. The white light emitting diode includes a blue LED light source, and a light conversion layer which converts incident light from the blue LED light source into white light. The light conversion layer includes a green light emitting semiconductor nanocrystal and a red light emitting semiconductor nanocrystal. The white light emitting diode has RGB color coordinates such that the white light emitting diode has a RGB color coordinate locus which is within a chrominance error range ($\pm 4\Delta E^*_{ab}$) locus from the constant hue locus (CHL) of each of sRGB color coordinates, or within a chrominance error range ($\pm 4\Delta E^*_{ab}$) locus from the CHL of each of AdobeRGB color coordinates.

In an embodiment, the white light emitting diode may have a color coordinate locus which is within a chrominance error range ($\pm 2\Delta E^*_{ab}$) locus from the CHL of each of sRGB color coordinates depicted in at least one of FIGS. 3 and 5, or within a chrominance error range ($\pm 2\Delta E^*_{ab}$) locus from the CHL of each of AdobeRGB color coordinates depicted in at least one of FIGS. 4 and 6.

In an embodiment, the white light emitting diode may have color coordinates of an x-coordinate of about 0.24±0.05 and a y-coordinate of about 0.21±0.05, and the color temperature may be about 9500 Kelvin (K) to about 100,000K.

In an embodiment, the light emitting peak wavelength of the blue LED light source may range from about 430 nanometers (nm) to about 470 nm, the light emitting peak wavelength of the green light emitting semiconductor nanocrystal may range from about 510 nm to about 560 nm, and the light emitting peak wavelength of the red light emitting semiconductor nanocrystal may range from about 600 nm to about 650 nm. Full width at half maximums ("FWHMs") of light emitting peaks of the green and red light emitting semiconductor nanocrystals may be about 60 nm or less. The FWHMs of light emitting peaks of the green and red light emitting semiconductor nanocrystals are about 40 nm or less.

In an embodiment, a ratio of an overlapping area (S) to a total area ($A_G$) of the light emitting spectrum of the green light emitting semiconductor nanocrystal, and/or a ratio of an overlapping area (S) to a total area ($A_R$) of the light emitting spectrum of the red light emitting semiconductor nanocrystal ($S/(A_G$ or $A_R)$), may be about 15% or less, about 7% or less, or about 5% or less.

In an embodiment, the light emitting peak wavelength of the blue LED light source may be about 440 nm to about 460 nm, the light emitting peak wavelength of the green light emitting semiconductor nanocrystal may be about 530 nm to about 550 nm, and the light emitting peak wavelength of the red light emitting semiconductor nanocrystal may be about 620 nm to about 640 nm.

In an embodiment, the light emitting intensity of the blue LED light source may be about 0.43±0.05, the light emitting intensity of the green light emitting semiconductor nanocrystal may be about 0.27±0.05, and the light emitting intensity of the red light emitting semiconductor nanocrystal may be about 0.28±0.05. Provided is a liquid crystal display device including the white light emitting diode, and a liquid crystal panel including a color filter which realizes images using the white light. The white light emitting diode includes a blue LED light source, and a light conversion layer which converts incident light from the blue LED light source into white light. The light conversion layer includes a green light emitting semiconductor nanocrystal and a red light emitting semiconductor nanocrystal. The white light emitting diode has RGB color coordinates, such that the white light emitting diode has a RGB color coordinate locus which is within a chrominance error range ($\pm 4\Delta E^*_{ab}$) locus from the CHL of each of sRGB color coordinates, or a chrominance error range ($\pm 4\Delta E^*_{ab}$) locus from the CHL of each of AdobeRGB color coordinates.

In an embodiment, the white light emitting diode may have color coordinate locus which is within a chrominance error range ($\pm 2\Delta E^*_{ab}$) locus from the CHL of each of sRGB color coordinates depicted in at least one of FIGS. 3 and 5, or within a chrominance error range ($\pm 3\Delta E^*_{ab}$) locus from the CHL of each of AdobeRGB color coordinates depicted in at least one of FIGS. 4 and 6.

BRIEF DESCRIPTION OF THE DRAWINGS

The above and other features of this disclosure will become more apparent by describing in further detail embodiments thereof with reference to the accompanying drawings, in which.

DETAILED DESCRIPTION

Figure 1:
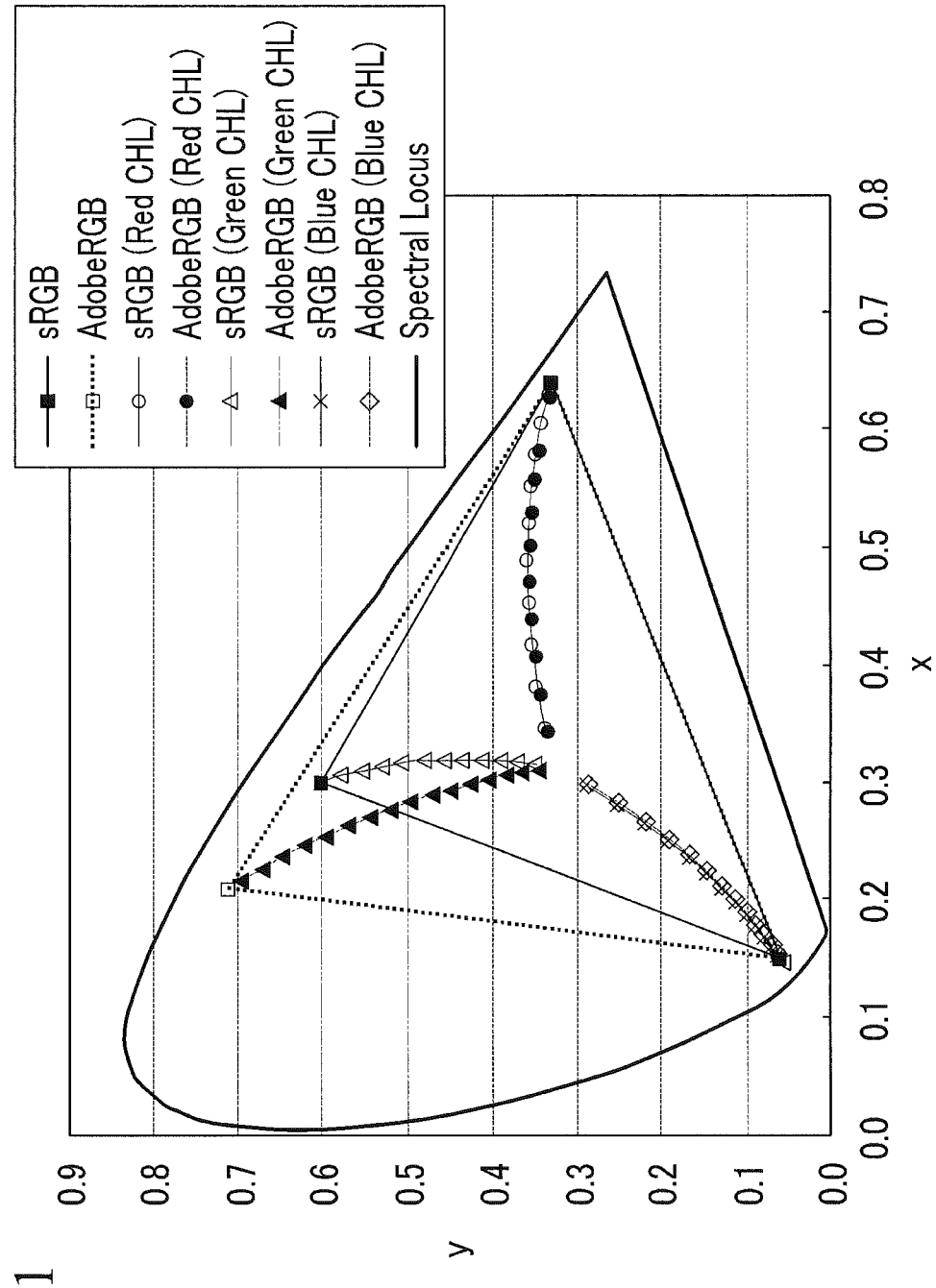
FIG. 1 and FIG. 2 are drawings showing color space and constant hue locus ("CHL") of embodiments of a white light emitting diode, according to the invention.

Embodiments will be described in detail hereinafter referring to the following accompanied drawings, and can be easily performed by those who have common knowledge in the related art. However, these embodiments are exemplary, and this disclosure is not limited thereto.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, connected may refer to elements being physically and/or electrically connected to each other.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "above," "below" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of a white light emitting diode ("LED") according to the invention will be described in detail.

The white light emitting diode includes a blue LED light source and a light conversion layer. The white light emitting diode converts incident light from the LED light source into white light. The light conversion layer includes green light emitting semiconductor nanocrystal and red light emitting semiconductor nanocrystal. The white light emitting diode has red, green and blue ("RGB") color coordinates depicted in at least one of FIGS. 3 to 6.

In the white light emitting diode, green light emitting semiconductor nanocrystal, and red light emitting semiconductor nanocrystal are excited by the light emitted from the blue LED light source to emit green light and red light. The green light and red light emitted from the white light emitting diode are combined with blue light that is transmitted through the light conversion layer, to realize white light.

If RGB primaries of the white light emitting diode have a similar hue to RGB primaries of standard red, green and blue ("sRGB") or Adobe RGB, the white light emitting diode may effectively provide color mapping of the color image information that is encoded and transferred by sRGB or Adobe RGB standards. By the color mapping, the white light emitting diode may at least reduce or effectively prevent distortion of the input color image information according to a viewer's point of view, and may utilize the light color space of output display at the most. In one embodiment of the present invention, a color gamut of the white light emitting diode is enlarged to include sRGB or Adobe RGB color space. In other words, the present invention may provide RGB primary positions of the white light emitting diode having the similar hue to the each RGB primaries of sRGB and Adobe RGB, and including at least a color space of sRGB or Adobe RGB according to the following process.

Using each XYZ of RGB primaries and International Commission on Illumination ("CIE") 1976 (L*, a*, b*) color space Color Appearance Model ("CIELAB"), hue, chroma, and lightness of each RGB primaries of sRGB are calculated.

Figure 2:
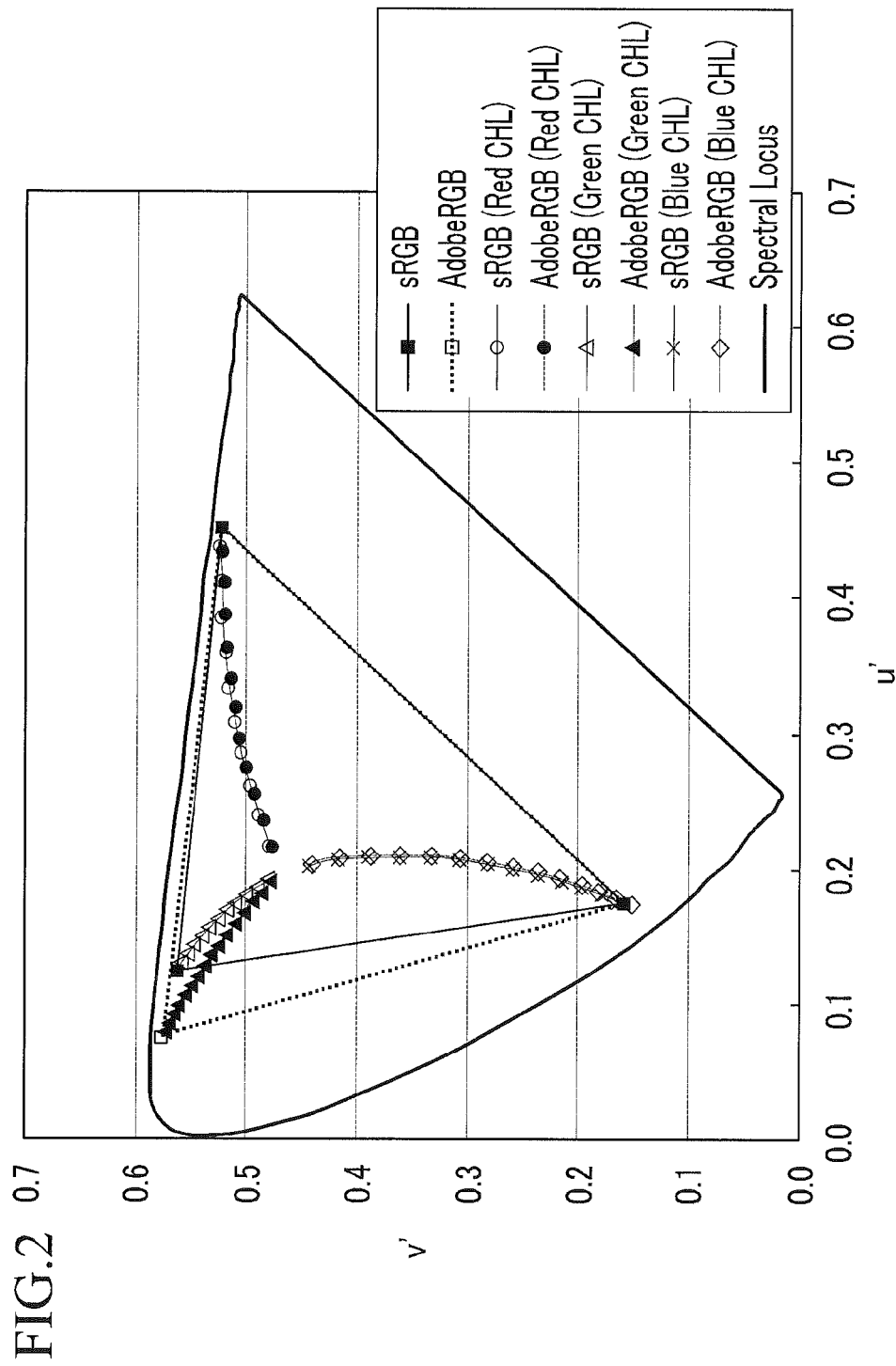

While maintaining the calculated hue and lightness, only chroma is increased from 0 to the range set by the spectral locus shown in FIG. 1 and FIG. 2 to provide a data set having the same hue and lightness and the different chroma from of each RGB primaries of sRGB.

Using the data set and an inverse color appearance model, XYZ values having the same hue and lightness and the different chroma from of each RGB primaries of sRGB are recalculated.

Figure 3:
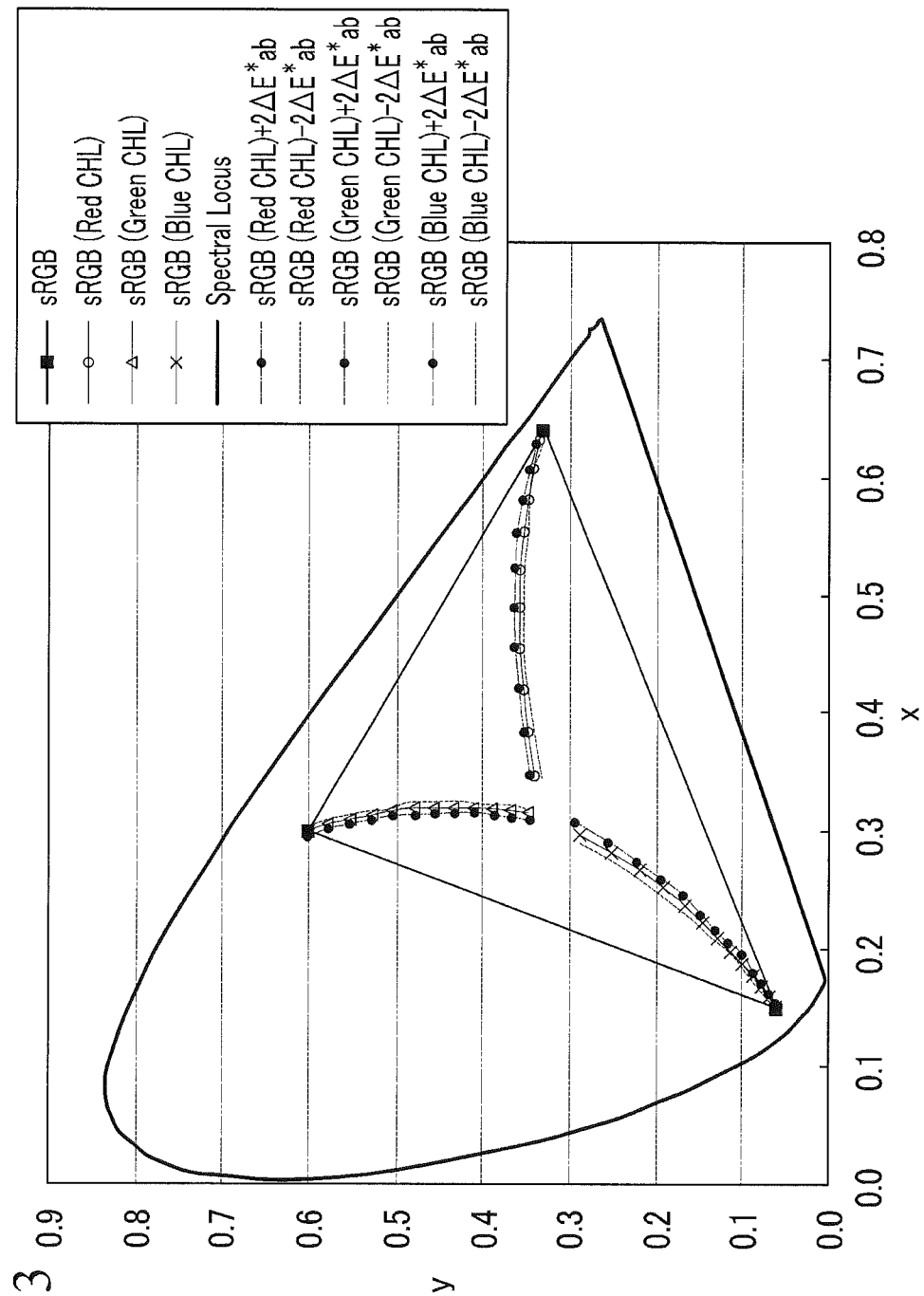
FIG. 3 is a drawing showing chrominance error range ($\pm 2\Delta E^*_{ab}$) locus from the CHL of each of the standard red, green and blue ("sRGB") color coordinates (x,y) shown in FIG. 1.
Figure 4:
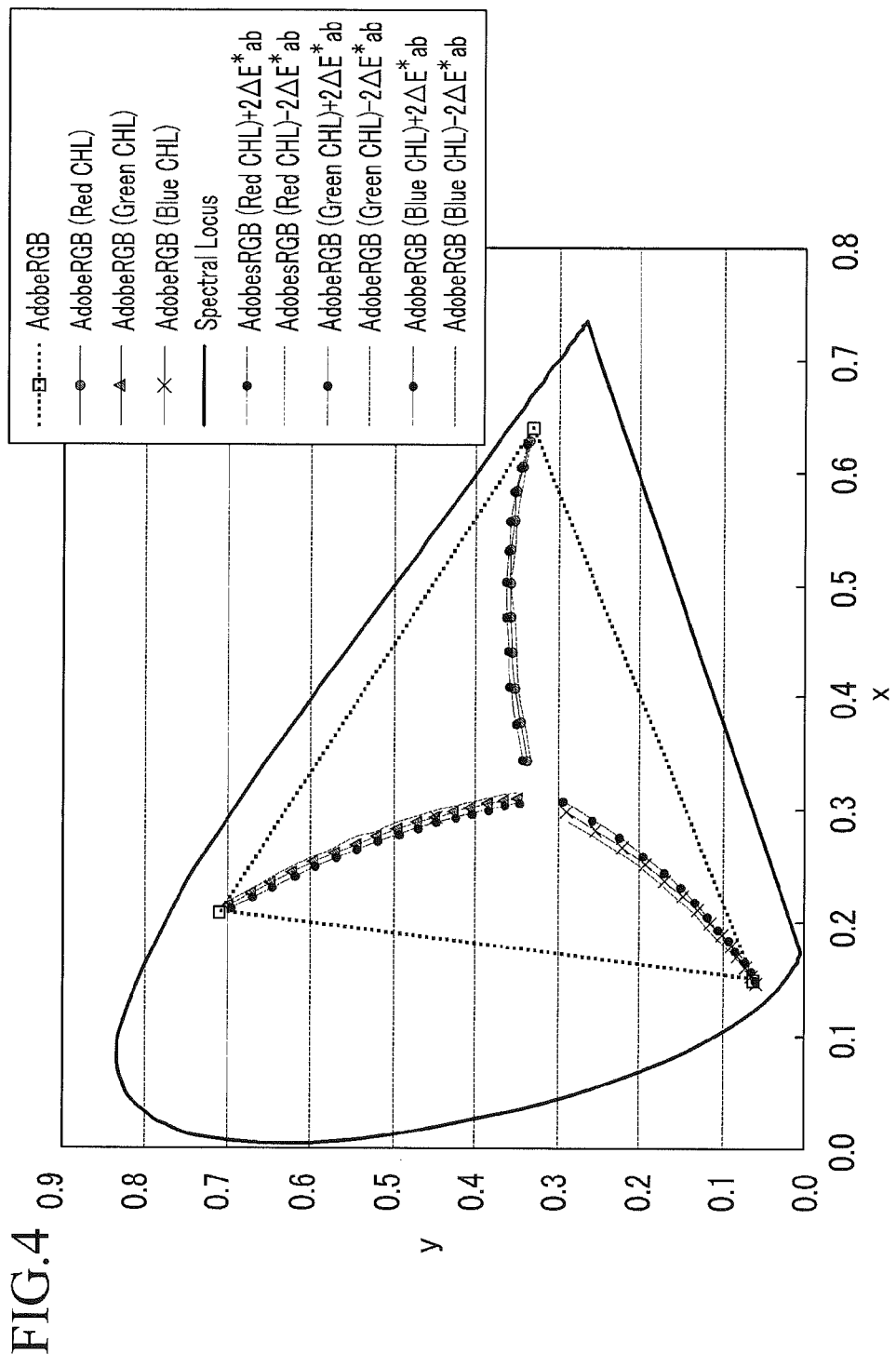
FIG. 4 is a drawing showing chrominance error range ($\pm 2\Delta E^*_{ab}$) locus from the CHL of each of Adobe RGB color coordinates (x,y) shown in FIG. 1.
Figure 5:
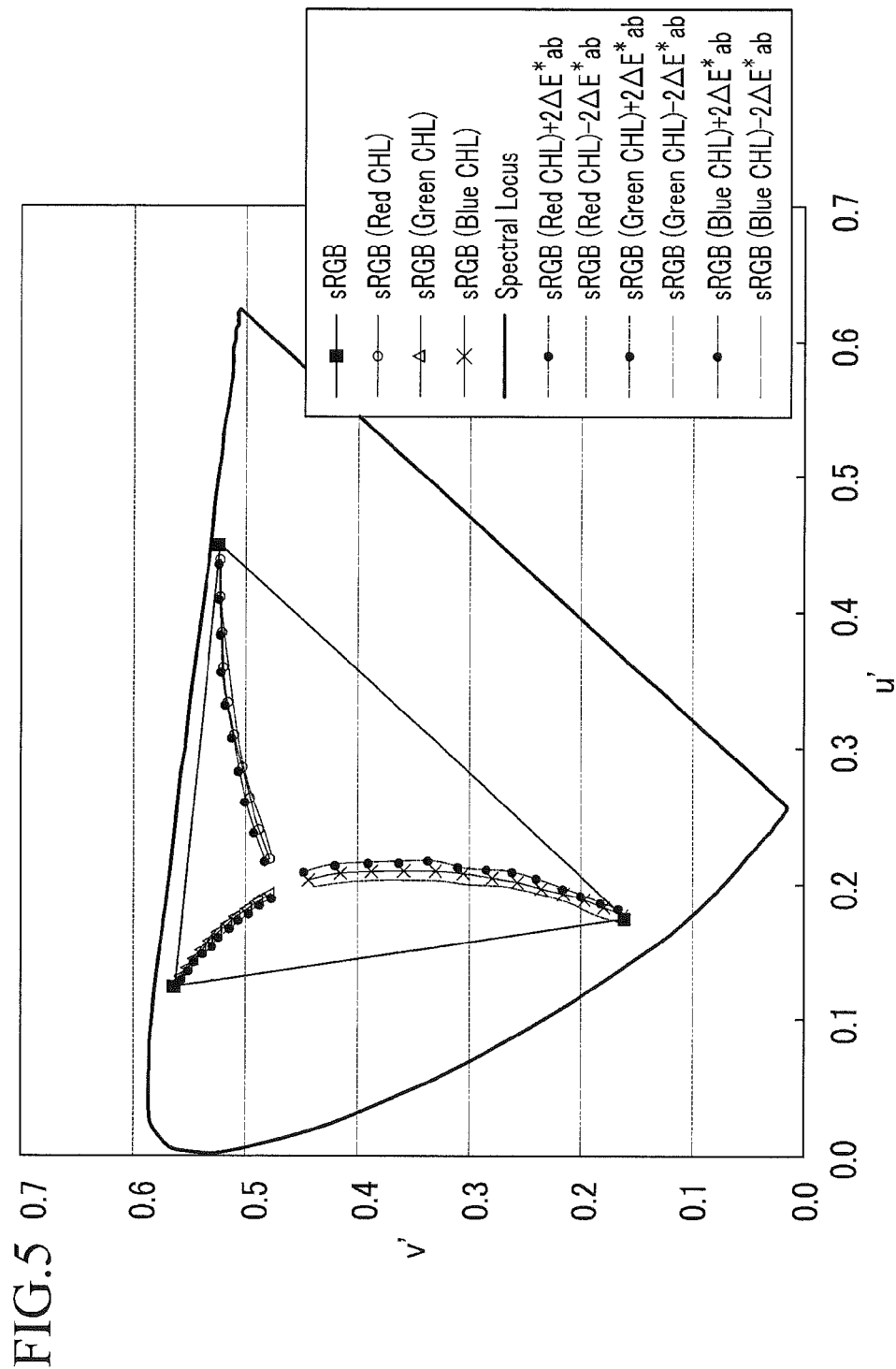
FIG. 5 is a drawing showing chrominance error range ($\pm 2\Delta E^*_{ab}$) locus from the CHL of each of sRGB color coordinates (u',v') shown in FIG. 2.
Figure 6:
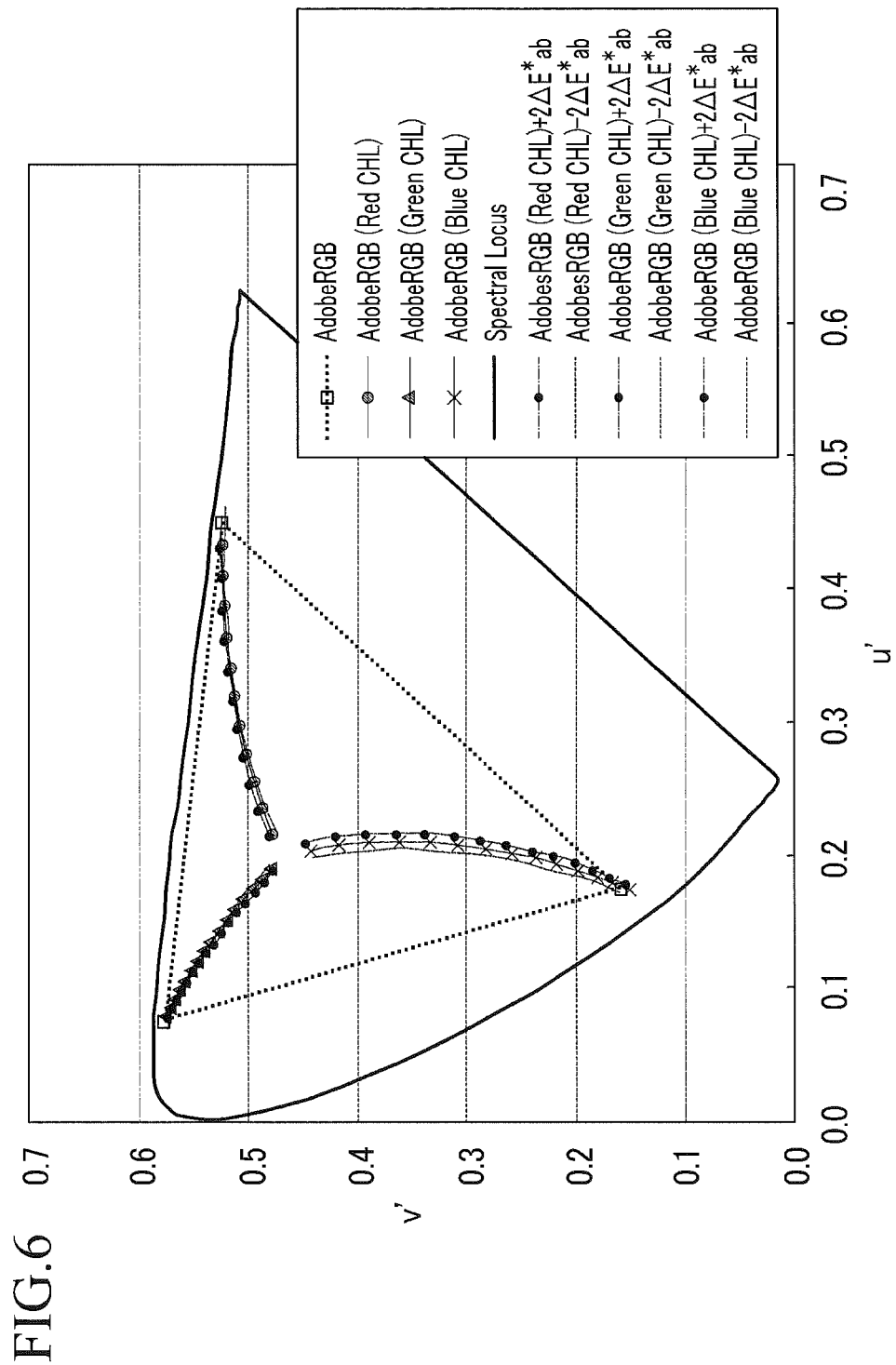
FIG. 6 is a drawing showing chrominance error range ($\pm 2\Delta E^*_{ab}$) locus from the CHL of each of AdobeRGB color coordinates (u',v') shown in FIG. 2.

The XYZ values are converted into xy values of CIE color coordinates, and these color coordinate values are connected to provide constant hue loci ("CHL") having the same hue characteristic as each RGB primaries of sRGB or Adobe RGB shown in FIG. 1. In addition, the XYZ values are converted into u'v' values of CIE color coordinates, and these color coordinates are connected to provide CHL having the same hue characteristic as each RGB primaries of sRGB or Adobe RGB shown in FIG. 2. FIG. 3 shows a chrominance error range ($\pm 2\Delta E^*_{ab}$) locus from the CHL of each of sRGB color coordinates (x,y) shown in FIG. 1, and FIG. 4 shows a chrominance error range ($\pm 2\Delta E^*_{ab}$) locus from the CHL of each of Adobe RGB color coordinates (x,y) shown in FIG. 1. FIG. 5 shows a chrominance error range ($\pm 2\Delta E^*_{ab}$) locus from the CHL of each of sRGB color coordinates (u',v') shown in FIG. 2, and FIG. 6 shows a chrominance error range ($\pm 2\Delta E^*_{ab}$) locus from the CHL of each of Adobe RGB color coordinates (u',v') shown in FIG. 2.

FIG. 3 shows the CHL of the sRGB color coordinates (x,y) and the chrominance error range ($\pm 2\Delta E^*_{ab}$) from the CHL, which are the same as in the following Table 1.

TABLE 1

| Constant hue locus | | Constant hue locus + $2\Delta E^*_{ab}$ | | Constant hue locus − $2\Delta E^*_{ab}$ | |
|---|---|---|---|---|---|
| x | y | x | y | x | y |
| Red (sRGB) | | | | | |
| 0.3479 | 0.3392 | 0.3487 | 0.3447 | 0.3457 | 0.3336 |
| 0.3838 | 0.3475 | 0.3849 | 0.3533 | 0.3817 | 0.3415 |
| 0.4197 | 0.3535 | 0.4209 | 0.3592 | 0.4179 | 0.3477 |
| 0.4551 | 0.3571 | 0.4562 | 0.3626 | 0.4535 | 0.3517 |
| 0.4893 | 0.3584 | 0.4901 | 0.3627 | 0.4883 | 0.3541 |
| 0.5220 | 0.3573 | 0.5226 | 0.3621 | 0.5210 | 0.3526 |
| 0.5526 | 0.3541 | 0.5530 | 0.3593 | 0.5518 | 0.3491 |
| 0.5809 | 0.3490 | 0.5809 | 0.3517 | 0.5807 | 0.3463 |
| 0.6068 | 0.3422 | 0.6066 | 0.3450 | 0.6069 | 0.3395 |
| 0.6302 | 0.3341 | 0.6296 | 0.3368 | 0.6305 | 0.3313 |
| 0.6512 | 0.3249 | 0.6503 | 0.3277 | 0.6519 | 0.3221 |
| 0.6699 | 0.3149 | 0.6687 | 0.3177 | 0.6709 | 0.3122 |
| 0.6871 | 0.3047 | 0.6858 | 0.3076 | 0.6882 | 0.3019 |
| 0.7036 | 0.2947 | 0.7024 | 0.2977 | 0.7047 | 0.2918 |
| 0.7194 | 0.2849 | 0.7183 | 0.2880 | 0.7205 | 0.2819 |
| Green (sRGB) | | | | | |
| 0.3152 | 0.3482 | 0.3107 | 0.3460 | 0.3197 | 0.3496 |
| 0.3172 | 0.3682 | 0.3123 | 0.3660 | 0.3221 | 0.3700 |
| 0.3188 | 0.3891 | 0.3139 | 0.3869 | 0.3237 | 0.3909 |
| 0.3197 | 0.4107 | 0.3149 | 0.4087 | 0.3246 | 0.4125 |
| 0.3201 | 0.4331 | 0.3161 | 0.4315 | 0.3241 | 0.4346 |
| 0.3197 | 0.4562 | 0.3150 | 0.4543 | 0.3244 | 0.4579 |
| 0.3186 | 0.4797 | 0.3132 | 0.4776 | 0.3240 | 0.4815 |
| 0.3166 | 0.5037 | 0.3137 | 0.5027 | 0.3197 | 0.5047 |
| 0.3138 | 0.5279 | 0.3106 | 0.5269 | 0.3171 | 0.5289 |
| 0.3101 | 0.5523 | 0.3066 | 0.5513 | 0.3137 | 0.5532 |
| 0.3054 | 0.5765 | 0.3017 | 0.5756 | 0.3093 | 0.5773 |
| 0.2999 | 0.6005 | 0.2960 | 0.5998 | 0.3039 | 0.6011 |
| 0.2934 | 0.6241 | 0.2893 | 0.6236 | 0.2975 | 0.6244 |
| 0.2860 | 0.6471 | 0.2818 | 0.6469 | 0.2903 | 0.6470 |
| 0.2777 | 0.6692 | 0.2734 | 0.6694 | 0.2821 | 0.6688 |
| Blue (sRGB) | | | | | |
| 0.2979 | 0.2882 | 0.3079 | 0.2917 | 0.2889 | 0.2862 |
| 0.2823 | 0.2517 | 0.2917 | 0.2546 | 0.2741 | 0.2495 |
| 0.2667 | 0.2196 | 0.2754 | 0.2221 | 0.2572 | 0.2170 |
| 0.2515 | 0.1916 | 0.2595 | 0.1939 | 0.2423 | 0.1892 |
| 0.2370 | 0.1674 | 0.2464 | 0.1699 | 0.2294 | 0.1654 |
| 0.2233 | 0.1465 | 0.2299 | 0.1482 | 0.2149 | 0.1444 |
| 0.2106 | 0.1286 | 0.2178 | 0.1303 | 0.2054 | 0.1273 |
| 0.1988 | 0.1131 | 0.2065 | 0.1149 | 0.1932 | 0.1119 |
| 0.1879 | 0.0998 | 0.1960 | 0.1016 | 0.1821 | 0.0986 |
| 0.1779 | 0.0884 | 0.1814 | 0.0891 | 0.1719 | 0.0872 |
| 0.1688 | 0.0785 | 0.1724 | 0.0792 | 0.1626 | 0.0773 |
| 0.1604 | 0.0700 | 0.1641 | 0.0706 | 0.1542 | 0.0689 |
| 0.1527 | 0.0626 | 0.1564 | 0.0632 | 0.1464 | 0.0615 |
| 0.1457 | 0.0561 | 0.1494 | 0.0567 | 0.1393 | 0.0551 |
| 0.1392 | 0.0505 | 0.1430 | 0.0511 | 0.1378 | 0.0503 |

The CHL of the AdobeRGB color coordinates (x,y) and the chrominance error range ($\pm 2\Delta E^*_{ab}$) from the CHL shown in FIG. 4 are the same as in the following Table 2.

TABLE 2

| Constant hue locus | | Constant hue locus + 2ΔE*$_{ab}$ | | Constant hue locus − 2ΔE*$_{ab}$ | |
|---|---|---|---|---|---|
| x | y | x | y | x | y |
| Red (Adobe RGB) | | | | | |
| 0.3441 | 0.3383 | 0.3449 | 0.3433 | 0.3421 | 0.3329 |
| 0.3761 | 0.3459 | 0.3772 | 0.3510 | 0.3744 | 0.3408 |
| 0.4083 | 0.3518 | 0.4094 | 0.3567 | 0.4067 | 0.3468 |
| 0.4402 | 0.3559 | 0.4412 | 0.3606 | 0.4388 | 0.3511 |
| 0.4714 | 0.3580 | 0.4723 | 0.3625 | 0.4702 | 0.3535 |
| 0.5015 | 0.3583 | 0.5022 | 0.3625 | 0.5005 | 0.3540 |
| 0.5301 | 0.3567 | 0.5306 | 0.3607 | 0.5294 | 0.3527 |
| 0.5571 | 0.3535 | 0.5574 | 0.3572 | 0.5566 | 0.3498 |
| 0.5822 | 0.3487 | 0.5822 | 0.3521 | 0.5820 | 0.3453 |
| 0.6054 | 0.3426 | 0.6051 | 0.3458 | 0.6054 | 0.3395 |
| 0.6265 | 0.3355 | 0.6260 | 0.3384 | 0.6269 | 0.3326 |
| 0.6457 | 0.3274 | 0.6450 | 0.3301 | 0.6463 | 0.3248 |
| 0.6631 | 0.3187 | 0.6622 | 0.3212 | 0.6639 | 0.3163 |
| 0.6788 | 0.3095 | 0.6777 | 0.3118 | 0.6798 | 0.3073 |
| 0.6931 | 0.3002 | 0.6920 | 0.3023 | 0.6942 | 0.2981 |
| Green (Adobe RGB) | | | | | |
| 0.3107 | 0.3469 | 0.3059 | 0.3437 | 0.3157 | 0.3492 |
| 0.3083 | 0.3656 | 0.3035 | 0.3625 | 0.3132 | 0.3682 |
| 0.3054 | 0.3851 | 0.3007 | 0.3821 | 0.3103 | 0.3879 |
| 0.3021 | 0.4056 | 0.2974 | 0.4025 | 0.3068 | 0.4084 |
| 0.2982 | 0.4269 | 0.2936 | 0.4238 | 0.3028 | 0.4298 |
| 0.2937 | 0.4490 | 0.2892 | 0.4459 | 0.2983 | 0.4520 |
| 0.2887 | 0.4719 | 0.2843 | 0.4688 | 0.2932 | 0.4749 |
| 0.2831 | 0.4956 | 0.2788 | 0.4924 | 0.2874 | 0.4985 |
| 0.2768 | 0.5198 | 0.2726 | 0.5167 | 0.2810 | 0.5227 |
| 0.2699 | 0.5446 | 0.2658 | 0.5416 | 0.2740 | 0.5475 |
| 0.2623 | 0.5698 | 0.2585 | 0.5669 | 0.2662 | 0.5726 |
| 0.2542 | 0.5954 | 0.2505 | 0.5925 | 0.2579 | 0.5980 |
| 0.2454 | 0.6210 | 0.2418 | 0.6183 | 0.2489 | 0.6235 |
| 0.2360 | 0.6467 | 0.2326 | 0.6441 | 0.2394 | 0.6490 |
| 0.2260 | 0.6721 | 0.2228 | 0.6698 | 0.2292 | 0.6742 |
| Blue (Adobe RGB) | | | | | |
| 0.2981 | 0.2887 | 0.3078 | 0.2921 | 0.2891 | 0.2868 |
| 0.2828 | 0.2526 | 0.2920 | 0.2555 | 0.2740 | 0.2503 |
| 0.2674 | 0.2208 | 0.2762 | 0.2235 | 0.2590 | 0.2186 |
| 0.2524 | 0.1931 | 0.2607 | 0.1954 | 0.2444 | 0.1909 |
| 0.2380 | 0.1690 | 0.2458 | 0.1711 | 0.2305 | 0.1670 |
| 0.2244 | 0.1481 | 0.2317 | 0.1500 | 0.2174 | 0.1464 |
| 0.2118 | 0.1302 | 0.2186 | 0.1319 | 0.2052 | 0.1286 |
| 0.2001 | 0.1147 | 0.2064 | 0.1162 | 0.1939 | 0.1133 |
| 0.1893 | 0.1014 | 0.1952 | 0.1027 | 0.1835 | 0.1002 |
| 0.1793 | 0.0899 | 0.1848 | 0.0911 | 0.1739 | 0.0888 |
| 0.1702 | 0.0800 | 0.1754 | 0.0810 | 0.1651 | 0.0790 |
| 0.1618 | 0.0713 | 0.1666 | 0.0722 | 0.1571 | 0.0705 |
| 0.1541 | 0.0638 | 0.1586 | 0.0646 | 0.1497 | 0.0631 |
| 0.1470 | 0.0573 | 0.1512 | 0.0580 | 0.1429 | 0.0566 |
| 0.1405 | 0.0516 | 0.1445 | 0.0522 | 0.1367 | 0.0510 |

The CHL of the sRGB color coordinate (u',v') and the chrominance error range (±2ΔE*$_{ab}$) from the CHL shown in FIG. 5 are the same as in the following Table 3.

TABLE 3

| Constant hue locus | | Constant hue locus + 2ΔE*$_{ab}$ | | Constant hue locus − 2ΔE*$_{ab}$ | |
|---|---|---|---|---|---|
| u' | v' | u' | v' | u' | v' |
| Red (sRGB) | | | | | |
| 0.2183 | 0.4789 | 0.2167 | 0.4818 | 0.2191 | 0.4757 |
| 0.2398 | 0.4885 | 0.2380 | 0.4915 | 0.2410 | 0.4852 |
| 0.2622 | 0.4969 | 0.2603 | 0.4998 | 0.2638 | 0.4939 |
| 0.2855 | 0.5041 | 0.2834 | 0.5068 | 0.2873 | 0.5014 |
| 0.3096 | 0.5102 | 0.3077 | 0.5123 | 0.3113 | 0.5081 |
| 0.3344 | 0.5151 | 0.3318 | 0.5173 | 0.3367 | 0.5127 |
| 0.3597 | 0.5187 | 0.3564 | 0.5211 | 0.3627 | 0.5163 |
| 0.3856 | 0.5212 | 0.3836 | 0.5225 | 0.3875 | 0.5200 |

TABLE 3-continued

| Constant hue locus | | Constant hue locus + 2ΔE*$_{ab}$ | | Constant hue locus − 2ΔE*$_{ab}$ | |
|---|---|---|---|---|---|
| u' | v' | u' | v' | u' | v' |
| 0.4119 | 0.5226 | 0.4094 | 0.5239 | 0.4142 | 0.5214 |
| 0.4385 | 0.5230 | 0.4355 | 0.5242 | 0.4413 | 0.5218 |
| 0.4654 | 0.5225 | 0.4619 | 0.5237 | 0.4688 | 0.5213 |
| 0.4926 | 0.5211 | 0.4885 | 0.5222 | 0.4965 | 0.5199 |
| 0.5203 | 0.5192 | 0.5157 | 0.5204 | 0.5247 | 0.5179 |
| 0.5487 | 0.5171 | 0.5437 | 0.5185 | 0.5535 | 0.5157 |
| 0.5779 | 0.5149 | 0.5724 | 0.5164 | 0.5832 | 0.5134 |
| Green (sRGB) | | | | | |
| 0.1925 | 0.4786 | 0.1903 | 0.4768 | 0.1950 | 0.4799 |
| 0.1870 | 0.4885 | 0.1846 | 0.4867 | 0.1896 | 0.4900 |
| 0.1813 | 0.4980 | 0.1790 | 0.4964 | 0.1838 | 0.4995 |
| 0.1755 | 0.5071 | 0.1732 | 0.5056 | 0.1778 | 0.5085 |
| 0.1694 | 0.5158 | 0.1676 | 0.5147 | 0.1713 | 0.5169 |
| 0.1632 | 0.5240 | 0.1611 | 0.5227 | 0.1654 | 0.5252 |
| 0.1569 | 0.5317 | 0.1546 | 0.5304 | 0.1594 | 0.5330 |
| 0.1506 | 0.5390 | 0.1493 | 0.5383 | 0.1519 | 0.5397 |
| 0.1442 | 0.5457 | 0.1428 | 0.5450 | 0.1456 | 0.5464 |
| 0.1377 | 0.5518 | 0.1362 | 0.5511 | 0.1392 | 0.5525 |
| 0.1313 | 0.5575 | 0.1297 | 0.5568 | 0.1329 | 0.5581 |
| 0.1249 | 0.5626 | 0.1232 | 0.5620 | 0.1265 | 0.5632 |
| 0.1185 | 0.5672 | 0.1168 | 0.5666 | 0.1202 | 0.5678 |
| 0.1122 | 0.5713 | 0.1105 | 0.5708 | 0.1140 | 0.5718 |
| 0.1060 | 0.5750 | 0.1043 | 0.5745 | 0.1079 | 0.5754 |
| Blue (sRGB) | | | | | |
| 0.2033 | 0.4424 | 0.2093 | 0.4461 | 0.1973 | 0.4398 |
| 0.2070 | 0.4152 | 0.2132 | 0.4188 | 0.2013 | 0.4124 |
| 0.2091 | 0.3874 | 0.2154 | 0.3909 | 0.2021 | 0.3838 |
| 0.2098 | 0.3595 | 0.2159 | 0.3629 | 0.2026 | 0.3558 |
| 0.2090 | 0.3322 | 0.2168 | 0.3364 | 0.2028 | 0.3289 |
| 0.2072 | 0.3058 | 0.2130 | 0.3089 | 0.1997 | 0.3020 |
| 0.2043 | 0.2807 | 0.2110 | 0.2841 | 0.1995 | 0.2783 |
| 0.2008 | 0.2571 | 0.2083 | 0.2608 | 0.1954 | 0.2545 |
| 0.1966 | 0.2351 | 0.2049 | 0.2390 | 0.1908 | 0.2324 |
| 0.1921 | 0.2147 | 0.1958 | 0.2164 | 0.1858 | 0.2119 |
| 0.1873 | 0.1961 | 0.1912 | 0.1977 | 0.1806 | 0.1932 |
| 0.1823 | 0.1790 | 0.1864 | 0.1807 | 0.1753 | 0.1761 |
| 0.1773 | 0.1634 | 0.1816 | 0.1651 | 0.1700 | 0.1606 |
| 0.1723 | 0.1493 | 0.1767 | 0.1509 | 0.1647 | 0.1466 |
| 0.1673 | 0.1365 | 0.1719 | 0.1381 | 0.1656 | 0.1360 |

The CHL of the Adobe RGB color coordinates (u',v') and the chrominance error range (±2ΔE*$_{ab}$) from the CHL shown in FIG. 6 are the same as in the following Table 4.

TABLE 4

| Constant hue locus | | Constant hue locus + 2ΔE*$_{ab}$ | | Constant hue locus − 2ΔE*$_{ab}$ | |
|---|---|---|---|---|---|
| u' | v' | u' | v' | u' | v' |
| Red (Adobe RGB) | | | | | |
| 0.2161 | 0.4779 | 0.2146 | 0.4805 | 0.2168 | 0.4748 |
| 0.2351 | 0.4865 | 0.2337 | 0.4892 | 0.2362 | 0.4837 |
| 0.2550 | 0.4943 | 0.2534 | 0.4968 | 0.2563 | 0.4917 |
| 0.2756 | 0.5012 | 0.2739 | 0.5036 | 0.2770 | 0.4988 |
| 0.2968 | 0.5071 | 0.2949 | 0.5094 | 0.2984 | 0.5049 |
| 0.3186 | 0.5121 | 0.3166 | 0.5141 | 0.3204 | 0.5100 |
| 0.3409 | 0.5161 | 0.3387 | 0.5180 | 0.3430 | 0.5142 |
| 0.3637 | 0.5192 | 0.3613 | 0.5209 | 0.3659 | 0.5174 |
| 0.3868 | 0.5213 | 0.3842 | 0.5229 | 0.3893 | 0.5197 |
| 0.4103 | 0.5226 | 0.4075 | 0.5240 | 0.4130 | 0.5211 |
| 0.4341 | 0.5230 | 0.4311 | 0.5243 | 0.4370 | 0.5217 |
| 0.4582 | 0.5227 | 0.4550 | 0.5238 | 0.4612 | 0.5215 |
| 0.4824 | 0.5217 | 0.4790 | 0.5227 | 0.4857 | 0.5206 |

TABLE 4-continued

| Constant hue locus | | Constant hue locus + 2ΔE*$_{ab}$ | | Constant hue locus − 2ΔE*$_{ab}$ | |
|---|---|---|---|---|---|
| u' | v' | u' | v' | u' | v' |
| 0.5068 | 0.5201 | 0.5033 | 0.5210 | 0.5103 | 0.5191 |
| 0.5316 | 0.5180 | 0.5279 | 0.5189 | 0.5352 | 0.5170 |
| Green (Adobe RGB) | | | | | |
| 0.1900 | 0.4773 | 0.1879 | 0.4750 | 0.1925 | 0.4792 |
| 0.1822 | 0.4860 | 0.1800 | 0.4838 | 0.1845 | 0.4879 |
| 0.1743 | 0.4944 | 0.1722 | 0.4924 | 0.1764 | 0.4963 |
| 0.1664 | 0.5026 | 0.1644 | 0.5007 | 0.1684 | 0.5044 |
| 0.1585 | 0.5105 | 0.1566 | 0.5087 | 0.1604 | 0.5122 |
| 0.1506 | 0.5181 | 0.1488 | 0.5163 | 0.1524 | 0.5197 |
| 0.1428 | 0.5253 | 0.1411 | 0.5237 | 0.1446 | 0.5269 |
| 0.1351 | 0.5322 | 0.1335 | 0.5307 | 0.1367 | 0.5336 |
| 0.1275 | 0.5387 | 0.1260 | 0.5373 | 0.1290 | 0.5401 |
| 0.1200 | 0.5449 | 0.1186 | 0.5436 | 0.1215 | 0.5462 |
| 0.1127 | 0.5507 | 0.1113 | 0.5494 | 0.1140 | 0.5518 |
| 0.1055 | 0.5561 | 0.1043 | 0.5549 | 0.1068 | 0.5571 |
| 0.0985 | 0.5611 | 0.0973 | 0.5601 | 0.0997 | 0.5620 |
| 0.0917 | 0.5657 | 0.0906 | 0.5648 | 0.0929 | 0.5666 |
| 0.0852 | 0.5699 | 0.0842 | 0.5691 | 0.0862 | 0.5707 |
| Blue (Adobe RGB) | | | | | |
| 0.2032 | 0.4428 | 0.2091 | 0.4463 | 0.1972 | 0.4402 |
| 0.2069 | 0.4160 | 0.2131 | 0.4195 | 0.2009 | 0.4129 |
| 0.2091 | 0.3885 | 0.2154 | 0.3921 | 0.2029 | 0.3853 |
| 0.2098 | 0.3611 | 0.2162 | 0.3646 | 0.2036 | 0.3578 |
| 0.2092 | 0.3341 | 0.2156 | 0.3376 | 0.2029 | 0.3308 |
| 0.2074 | 0.3080 | 0.2137 | 0.3113 | 0.2012 | 0.3048 |
| 0.2047 | 0.2831 | 0.2109 | 0.2863 | 0.1986 | 0.2801 |
| 0.2012 | 0.2597 | 0.2074 | 0.2627 | 0.1953 | 0.2568 |
| 0.1972 | 0.2378 | 0.2032 | 0.2406 | 0.1914 | 0.2351 |
| 0.1928 | 0.2175 | 0.1986 | 0.2201 | 0.1872 | 0.2150 |
| 0.1881 | 0.1988 | 0.1937 | 0.2013 | 0.1826 | 0.1965 |
| 0.1832 | 0.1817 | 0.1886 | 0.1840 | 0.1779 | 0.1796 |
| 0.1783 | 0.1662 | 0.1835 | 0.1682 | 0.1732 | 0.1642 |
| 0.1733 | 0.1520 | 0.1783 | 0.1538 | 0.1685 | 0.1502 |
| 0.1684 | 0.1391 | 0.1732 | 0.1408 | 0.1638 | 0.1375 |

According to one embodiment, the color coordinates of RGB primaries of the white light emitting diode are set to follow any one color coordinate locus which is within a chrominance error range (±4ΔE*$_{ab}$) locus from the CHL of each of sRGB color coordinates, or within a chrominance error range (±4ΔE*$_{ab}$) locus from the CHL of each of AdobeRGB color coordinates, so as to effectively include sRGB color space and effectively realize color near the Adobe RGB color space. In an exemplary embodiment, for example, a RGB color coordinate locus of the white light emitting diode may be within a chrominance error range (±2ΔE*$_{ab}$) locus from the CHL of each of sRGB color coordinates shown in FIGS. 3 and 5, or within a chrominance error range (±2ΔE*$_{ab}$) locus from the CHL of each of AdobeRGB color coordinates shown in FIGS. 4 and 6.

The white light emitting diode having RGB primaries according to the CHL of sRGB or AdobeRGB or a predetermined chrominance error range locus may minimize the color loss of the input color image information that is encoded by being applied with sRGB or Adobe RGB color space, and effectively utilize the light color space characteristic of a display mounted with the white light emitting diode.

The white light emitting diode may have color coordinates of an x-coordinate of about 0.24±0.05 and a y-coordinate of about 0.21±0.05, and the color temperature may be about 9500 Kelvin (K) to about 100,000K. When the color coordinates and color temperature are within the above ranges, white light having a wider range of color reproducibility can be realized, and it may be used as a light source of a display to express various colors.

The light emitting peak wavelength of the blue LED light source may range from about 430 nanometers (nm) to about 470 nm. The light emitting peak wavelength of the green light emitting semiconductor nanocrystal may range from about 510 nm to about 560 nm, and for example, about 530 nm to about 550 nm. The light emitting peak wavelength of the red light emitting semiconductor nanocrystal may range from about 600 nm to about 650 nm, for example, about 620 nm to about 640 nm.

Full width at half maximums ("FWHMs") of light emitting peaks of the green and red light emitting semiconductor nanocrystals may be about 60 nm or less. In one embodiment, the FWHMs of light emitting peaks of the green and red light emitting semiconductor nanocrystals are about 40 nm or less. When the wavelength and FWHMs fall within the above range, a light emitting device having improved color reproducibility and luminance may be provided.

A ratio of an overlapping area (S) to a total area ($A_G$) of the light emitting spectrum of the green light emitting semiconductor nanocrystal, and/or a ratio of an overlapping area (S) to a total area ($A_R$) of the light emitting spectrum of the red light emitting semiconductor nanocrystal, (e.g., S/($A_G$ or $A_R$)) may be about 15% or less, about 7% or less, or about 5% or less. When the S/($A_G$ or $A_R$) falls within the above range, a light emitting device having improved color reproducibility and luminance may be provided.

In order to control the color coordinate of white light, the light emitting intensity of the blue LED light source may be about 0.43±0.05, the light emitting intensity of the green light emitting semiconductor nanocrystal may be about 0.27±0.05, and the light emitting intensity of the red light emitting semiconductor nanocrystal may be about 0.28±0.05. When the light emitting intensities are within the above ranges, white light having a wider range of color reproducibility can be realized.

The semiconductor nanocrystal may include a Group II-VI compound, a Group III-V compound, a Group IV-VI compound, a Group IV compound, etc. The semiconductor nanocrystal particles may have a core-shell structure. The interface of the core and shell may have a concentration gradient structure with decreasing concentration of elements existing at the shell toward a center.

The Group II-VI compound may include a binary element compound selected from the group consisting of CdSe, CdTe, ZnS, ZnSe, ZnTe, ZnO MgSe, MgS, and a mixture thereof, a ternary element compound selected from the group consisting of CdSeS, CdSeTe, CdSTe, ZnSeS, ZnSeTe, ZnSTe, CdZnS, CdZnSe, CdZnTe, MgZnSe, MgZnS, and a mixture thereof, and a quaternary element compound selected from the group consisting of CdZnSeS, CdZnSeTe, CdZnSTe, and a mixture thereof.

The Group III-V compound may include a binary element compound selected from the group consisting of GaN, GaP, GaAs, GaSb, AlN, AlP, AlAs, AlSb, InN, InP, InAs, InSb, and a mixture thereof, a ternary element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and a quaternary element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. A light emitting peak wavelength and FWHM may be controlled by particle size, composition, or concentration gradient of the semiconductor nanocrystal.

Figure 7:
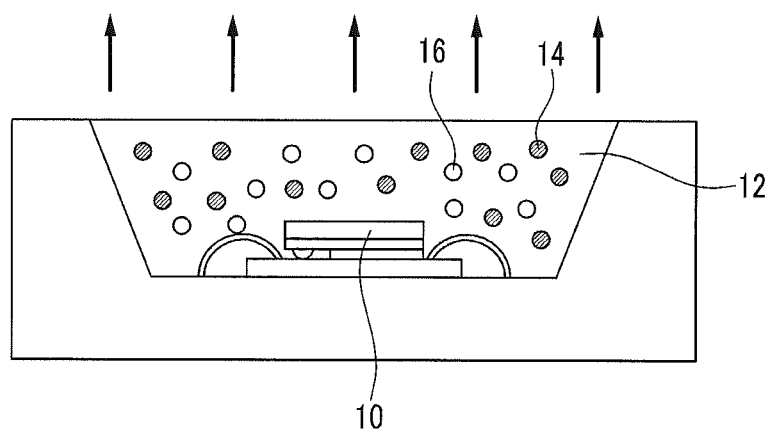
FIGS. 7 to 10 are cross-sectional views of embodiments of white light emitting diodes including a light conversion layer of various structures, according to the invention.

The light conversion layer of the white light emitting diode may be designed with various structures on the blue LED light source, where the light conversion layer and the blue LED light source are totally within an area or volume defined in a base. In one embodiment, for example, a light conversion layer 12 may include of a single mixed layer of a plurality of a green light emitting semiconductor nanocrystal 14 and a plurality of a red light emitting semiconductor nanocrystal 16, on a blue LED light source 10, as shown in FIG. 7. Emitted light from the white light emitting diode is shown as upward arrows in FIG. 7.

Figure 8:
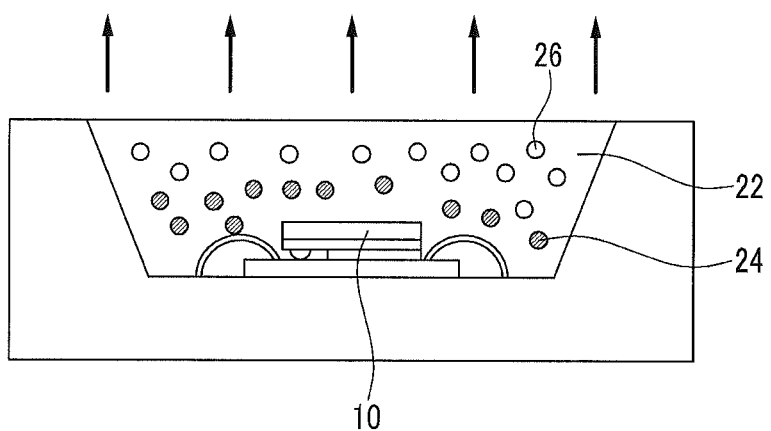

Further, as shown in FIG. 8, the white light emitting diode may include a light conversion layer 22 including a plurality of a green light emitting semiconductor nanocrystal 24 on the blue LED light source 10, and a plurality of a red light emitting semiconductor nanocrystal 26 on the blue LED light source 10, such that an entire of the plurality of the green light emitting semiconductor nanocrystal 24 is between the blue LED light source 10 and the plurality of a red light emitting semiconductor nanocrystal 26. In one embodiment, the light conversion layer 22 may be formed by coating the plurality of the green light emitting semiconductor nanocrystal 24 on the blue LED light source 10, and then coating the plurality of the red light emitting semiconductor nanocrystal 26 on the plurality of the green light emitting semiconductor nanocrystal 24.

Figure 9:
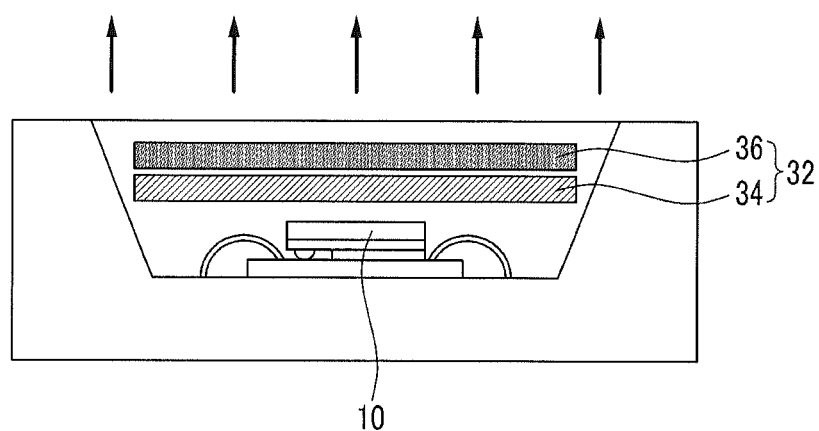

As shown in FIG. 9, the white light emitting diode may include a light conversion layer 32 including a single continuous red light emitting semiconductor nanocrystal layer 34 on the blue LED light source 10, and a single continuous green light emitting semiconductor nanocrystal layer 36 on the blue LED light source 10, such that the red and green nanocrystal layers 35 and 36 are separate and distinct layers, with an entire of the red nanocrystal layer 34 between the blue light source 10 and the green nanocrystal layer 36. The positions of the red light emitting semiconductor nanocrystal layer 34 and the green light emitting semiconductor nanocrystal layer 36 may be changed with each other. In one embodiment, the light conversion layer 32 may include an entire of the green light emitting semiconductor nanocrystal layer 36 on the blue LED light source 10, and between the red light emitting semiconductor nanocrystal layer 34 and the blue LED light source 10. Although a light conversion layer having only two deposited layers is shown in FIG. 9, a conversion layer having a plurality of layers can be provided.

Figure 10:
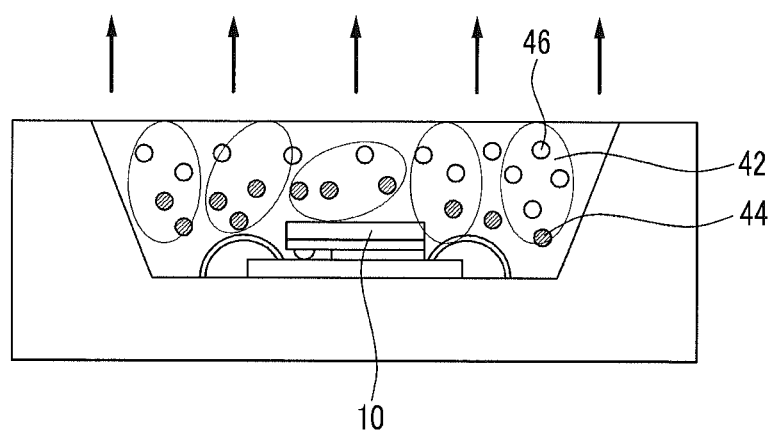

As shown in FIG. 10, the white light emitting diode includes a light conversion layer 42 including a plurality of a composite particle, each of the composite particles including a green semiconductor nanocrystal 44 and red semiconductor nanocrystal 46. Each of the composite particles is considered as an individual, separate and discrete unit, as indicated by the oval circles around a group of semiconductor nanocrystals. Each of the composite particles may include one or more of the green semiconductor nanocrystal 44, and one or more of the red semiconductor nanocrystal 46.

The white light emitting diode may be used as a backlight unit of a liquid crystal display device. A liquid crystal display device according to the invention includes a white light emitting diode having an above-described construction or a combination thereof, and a liquid crystal panel including a color filter that realizes images using the white light emitted by the white light emitting diode.

Figure 11:
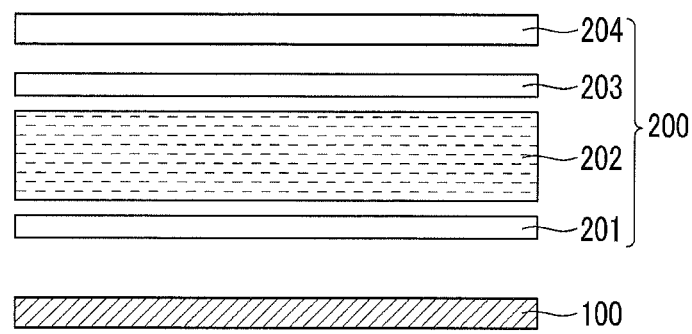
FIG. 11 is a schematic diagram of an embodiment of a liquid crystal display device, according to the invention.

FIG. 11 schematically shows an embodiment a liquid display device, according to the invention.

Referring to FIG. 11, the liquid crystal display device includes a backlight unit 100 and a liquid crystal panel 200 that forms images of a predetermined color using white light emitted from the backlight unit 100. The backlight unit 100 may be or include the white light emitting diode of the previously described embodiments.

The liquid crystal panel 200 may include a first polarizer 201, a liquid crystal layer 202, a second polarizer 203, and a color filter 204, which are sequentially disposed. The white light emitted from the backlight unit 100 is transmitted through the first polarizer 201, the liquid crystal layer 202, and the second polarizer 203, and the transmitted white light enters into the color filter 204 to form the images of the predetermined color. Between the backlight unit 100 and the liquid crystal panel 200, a diffusion plate may be positioned.

Hereinafter, the embodiments are illustrated in more detail with reference to examples. However, the following examples are embodiments and are not limiting.

PREPARATION EXAMPLE 1

Synthesis of Green Light Emitting Multi-Layered Semiconductor Nanocrystal 16 grams (g) of trioctylamine ("TOA"), 0.128 g of octadecylphosphonic acid, and 0.1 millimole (mmol) of cadmium oxide are simultaneously introduced into a 125 milliliter (mL) flask equipped with a reflux condenser, and the reaction temperature is controlled to about 300 degrees Celsius (° C.) while agitating the reaction mixture. Separately, Se powder is dissolved in trioctylphosphine ("TOP") to prepare a Se-TOP complex solution with a Se concentration of about 2 moles (M). To the agitated reaction mixture, 2 mL of the 2M Se-TOP complex solution is rapidly implanted, and the mixture is reacted for about 2 minutes. After the reaction is completed, the temperature of the reaction mixture is lowered to room temperature as soon as possible, a non-solvent ethanol is added thereto, and centrifugation is conducted. A supernatant of the solution excluding the centrifuged precipitate is discarded, and the precipitate is dispersed in toluene to synthesize a CdSe nanocrystal solution.

8 g of TOA, 0.1 g of oleic acid, and 0.1 mmol of zinc acetate are simultaneously introduced into a 125 mL flask equipped with a reflux condenser, and the reaction temperature is controlled to about 300° C. while agitating the reaction mixture. The above synthesized CdSe nanocrystal solution is added to the reaction mixture, and then 0.5 mL of a 0.8M S-TOP complex solution is slowly added thereto, the mixture is reacted for about 1 hour to grow ZnS nanocrystal on the surface of CdSe nanocrystal, and an alloy layer is formed by diffusion at the interface. After the reaction is completed, centrifugation is carried out by the same method as for separating the CdSe nanocrystal, and then the precipitate is dispersed in toluene to synthesize multi-layered CdSe/ZnS nanocrystal.

On the surface of the CdSe/ZnS nanocrystal, CdZnS is formed again. 0.05 mmol of cadmium acetate, 0.1 mmol of zinc acetate, 0.43 g of oleic acid, and 8 g of TOA are introduced into a 125 mL flask equipped with a reflux condenser, and the reaction temperature is controlled to about 300° C. while agitating the reaction mixture, and then the above synthesized nanocrystal CdSe/ZnS is implanted therein. Immediately, 0.08 mmol of octyl thiol mixed with 2 mL of TOA is slowly implanted therein and reacted for about 1 hour to form nanocrystal with a CdSe/ZnS/CdZnS multi-layered structure. After the reaction is completed, the synthesized material is separated by centrifugation and dispersed in toluene.

PREPARATION EXAMPLE 2

Synthesis of Red Light Emitting Multi-Layered Semiconductor Nanocrystal 32 g of TOA, 1.8 g of oleic acid, and 1.6 mmol of cadmium oxide are simultaneously introduced into a 125 mL flask equipped with a reflux condenser, and the reaction temperature is controlled to about 300° C. while agitating the reaction mixture. 0.2 mL of the 2M Se-TOP complex solution synthesized in Example 1 is rapidly implanted in the reactant, and after 1 minute 30 seconds, 0.8 mmol of octyl thiol mixed with 6 mL of TOA is slowly implanted therein. After reaction for about 40 minutes, 16 mL of a separately synthesized zinc oleate complex solution is slowly implanted.

The zinc oleate complex solution is synthesized by introducing 4 mmol of zinc acetate, 2.8 g of oleic acid, and 16 g of TOA into a 12 mL flask equipped with a reflux condenser, and controlling reaction temperature to about 200° C. while agitating the reaction mixture. After lowering the temperature to about 100° C. or less, the zinc oleate complex solution is implanted. Immediately after completing the implanting of the zinc oleate complex solution, 6.4 mmol of octyl thiol complex solution mixed with 6 mL of TOA is slowly added thereto and the mixture is reacted for about 2 hours. Thereby, CdSe nanocrystal is produced, and then CdS nanocrystal is grown on the surface and ZnS is grown again, sequentially.

After the reaction is completed, the temperature of the reaction mixture is lowered to room temperature as soon as possible, and non-solvent ethanol is added thereto and centrifugation is conducted. A supernatant of the solution excluding the centrifuged precipitate is discarded, and the precipitate is dispersed in toluene to synthesize multi-layered nanocrystal CdSe/CdS/ZnS with a size of about 8 nm.

Example 1

Manufacture of White Light Emitting Diode

To the green light emitting semiconductor nanocrystal synthesized in Preparation Example 1 and the red light emitting semiconductor nanocrystal synthesized in Preparation Example 2, a mixed solution of hexane and ethanol with a volume ratio of about 6:4 is added, and the mixture is centrifuged at about 6000 revolutions per minute (rpm) for about 10 minutes to obtain a precipitate. To the obtained precipitate, a chloroform solvent is added to prepare a solution of about 1 percent by weight (wt %) of the choloroform solvent. As an epoxy resin, SJ4500 A and SJ4500 B manufactured by Dow Corning® corporation are mixed at a volume ratio of about 1:1 beforehand, and air bubbles are removed. 1 wt % of the green light emitting semiconductor nanocrystal, 1 wt % of the red light emitting semiconductor nanocrystal, 0.1 mL of the chloroform solution, and 0.1 mL of the epoxy resin are mixed, and the mixture is agitated so as to be uniform and maintained under vacuum for about 1 hour to remove the chloroform solution. The prepared mixture of the green light emitting semiconductor nanocrystal, the red light emitting semiconductor nanocrystal, and the epoxy resin is coated on a lamp-type blue light emitting diode of a cup shape in an amount of about 20 mL, and cured at about 100° C. for about 3 hours to prepare a light conversion layer.

After primarily preparing the blue light emitting diode and the light conversion layer according to the above methods, for molding into a lamp shape, only epoxy resin is introduced into a mold and primarily cured, and the blue light emitting diode including the primarily cured light conversion layer is cured again at about 100° C. for about 3 hours to manufacture a lamp shape light emitting diode.

COMPARATIVE EXAMPLE 1

Manufacture of White Light Emitting Diode

To the red light emitting semiconductor nanocrystal synthesized in Preparation Example 2, a mixed solution of hexane and ethanol with a volume ratio of 6:4 is added, and the mixture is centrifuged at about 6000 rpm for about 10 minutes to obtain a precipitate. A chloroform solvent is added to the obtained precipitate to prepare a solution of about 1 wt %. As epoxy resin, SJ4500 A and SJ4500 B manufactured by Dow Corning® Corporation is mixed at a volume ratio of about 1:1 beforehand, and air bubbles are removed. 1 wt % of the red light emitting semiconductor nanocrystal, 0.1 mL of the chloroform solution, and 0.1 mL of the epoxy resin are mixed, and the mixture is agitated so as to be uniform and maintained under vacuum for about 1 hour in order to remove the chloroform solution. 0.05 g of TG-3540 green inorganic phosphor manufactured by Sarnoff corporation is added thereto, and then the obtained mixture is coated on a lamp type blue light emitting diode of a cup shape in an amount of about 20 mL, and cured at about 100° C. for about 3 hours to prepare a light conversion layer.

After primarily preparing the blue light emitting diode and the light conversion layer according to the above method, for molding into a lamp shape, only epoxy resin is introduced into a mold and primarily cured, and the blue light emitting diode including the primarily cured light conversion layer is cured again at about 100° C. for about 3 hours to manufacture a lamp shape light emitting diode.

COMPARATIVE EXAMPLE 2

Manufacture of White Light Emitting Diode

To the green light emitting semiconductor nanocrystal synthesized in Preparation Example 1, a mixed solution of hexane and ethanol with a volume ratio of about 6:4 is added, and the mixture is centrifuged at about 6000 rpm for about 10 minutes to obtain a precipitate. A chloroform solution is added to the obtained precipitate to prepare a solution of about 1 wt %. As an epoxy resin, SJ4500 A and SJ4500 B manufactured by Dow Corning® Corporation is mixed at a volume ratio of about 1:1 beforehand, and air bubbles are removed. 1 wt % of the green light emitting semiconductor nanocrystal, 0.1 mL of the chloroform solution, and 0.1 mL of the epoxy resin are mixed, and the mixture is agitated so as to be uniform and maintained under vacuum for about 1 hour to remove the chloroform solution. 0.1 g of Sr—Mg—$P_4O_{16}$ series red inorganic phosphor manufactured by Sarnoff Corporation is added thereto, and then the obtained mixture is coated on a lamp type blue light emitting diode of a cup shape in an amount of about 20 mL, and cured at about 100° C. for about 3 hours to prepare a light conversion layer.

After primarily preparing the blue light emitting diode and the light conversion layer according to the above method, for molding into a lamp shape, only epoxy resin is introduced into a mold and primarily cured, and the blue light emitting diode including the primarily cured light conversion layer is cured again at about 100° C. for about 3 hours to manufacture a lamp shape light emitting diode.

COMPARATIVE EXAMPLE 3

0.05 g of TG-3540 green inorganic phosphor and 0.1 g of Sr—Mg—$P_4O_{16}$ series red inorganic phosphor manufactured by Sarnoff Corporation are agitated with 0.1 mL of epoxy resin to uniformly mix them. The prepared mixture of the inorganic phosphor and epoxy resin is coated on a lamp type blue light emitting diode of a cup shape in an amount of about 20 mL, and cured at about 100° C. for about 3 hours to prepare a light conversion layer.

After primarily curing the blue light emitting diode and the light conversion layer according to the above method, for molding into a lamp shape, only epoxy resin is introduced into a mold and primarily cured, and the blue light emitting diode including the primarily cured light emission layer is cured again at about 100° C. for about 3 hours to manufacture a lamp shape light emitting diode.

Using the spectrums of the green semiconductor nanocrystal synthesized in Preparation Example 1, the red semiconductor nanocrystal synthesized in Preparation Example 2, and the green and red inorganic phosphor of Comparative Example 3, color coordinates corresponding to red, green, and blue are calculated to obtain relative color reproducibility and relative luminance. The results are described in Table 5. In Table 5, at the bottom of each color coordinate, the light emitting intensity for adjusting the white color coordinate is described together.

TABLE 5

|  | Red | Green | Blue | Color Coordinate | | |
|---|---|---|---|---|---|---|
|  |  |  |  | Red | Green | Blue |
| Ex. 1 | Semiconductor nanocrystal | Semiconductor nanocrystal | LED | (0.673, 0.308) 0.28 | (0.190, 0.707) 0.29 | (0.150, 0.057) 0.43 |
| Comp. Ex. 1 | Semiconductor nanocrystal | Phosphor | LED | (0.658, 0.318) 0.17 | (0.277, 0.655) 0.37 | (0.151, 0.046) 0.46 |
| Comp. Ex. 2 | Phosphor | Semiconductor nanocrystal | LED | 0.675, 0.305) 0.46 | (0.205, 0.697) 0.21 | (0.151, 0.056) 0.33 |
| Comp. Ex. 3 | Phosphor | Phosphor | LED | 0.659, 0.316) 0.31 | (0.282, 0.652) 0.30 | 0.151, 0.046) 0.39 |

As shown in Table 5, the light emitting diode according to Example 1 using green and red semiconductor nanocrystals has a color coordinate range shown in FIGS. 1 to 6.

Accordingly, the white light emitting diode according to Example 1 may effectively include sRGB or Adobe RGB color space and may effectively color-map the color image information that is encoded and transferred by sRGB or Adobe RGB standards.

The semiconductor nanocrystal is measured regarding color coordinates depending upon the light emitting peak wavelength, and the results are shown in the following Table 6.

As shown in the above Table 6, when the light emitting peak wavelengths of green and red semiconductor nanocrystals are in the range of about 530 nm to about 540 nm, and about 620 nm to about 640 nm, color coordinates fall within color coordinates depicted in FIGS. 3 to 6.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:
1. A back light unit comprising:
a light emitting diode light source; and
a light conversion layer which converts incident light from the light emitting diode light source into white light,
wherein at least two of red, green and blue color coordinate loci of the white light are within a chrominance error range (±4ΔE*ab) locus from the constant hue locus of sRGB color coordinates, or within a chrominance error range (±4ΔE*ab) locus from the constant hue locus of AdobeRGB color coordinates,
wherein the light conversion layer comprises semiconductor nanocrystals.
2. The back light unit of claim 1, wherein the at least two of red, green and blue color coordinate loci of the white light are within a chrominance error range (±2ΔE*ab) locus from the constant hue locus of sRGB color coordinates, or within a

TABLE 6

| Red | Green | Blue | Red color coordinate | Green color coordinate | Blue color coordinate |
|---|---|---|---|---|---|
| semiconductor nanocrystal 630 nm | semiconductor nanocrystal 530 nm | LED | (0.673, 0.308) 0.28 | (0.190, 0.707) 0.29 | (0.150, 0.057) 0.43 |
| semiconductor nanocrystal 640 nm | semiconductor nanocrystal 530 nm | LED | (0.686, 0.296) 0.33 | (0.178, 0.717) 0.27 | (0.150, 0.058) 0.4 |
| semiconductor nanocrystal 630 nm | semiconductor nanocrystal 540 nm | LED | (0.671, 0.307) 0.25 | (0.239, 0.691) 0.29 | (0.152, 0.045) 0.46 |
| semiconductor nanocrystal 640 nm | semiconductor nanocrystal 540 nm | LED | (0.683, 0.295) 0.29 | (0.231, 0.699) 0.28 | (0.152, 0.045) 0.43 |
| semiconductor nanocrystal 620 nm | semiconductor nanocrystal 530 nm | LED | (0.658, 0.323) 0.25 | (0.212, 0.690) 0.29 | 0.150, 0.056) 0.46 | chrominance error range (±2ΔE*ab) locus from the constant hue locus of AdobeRGB color coordinates.

3. The back light unit of claim 1, wherein the at least two of red, green and blue color coordinate loci of the white light which are within a chrominance error range (±4ΔE*ab) locus from the constant hue locus of sRGB color coordinates, or within a chrominance error range (±4ΔE*ab) locus from the constant hue locus of AdobeRGB color coordinates include the blue color coordinate locus.

4. The back light unit of claim 3, wherein the at least two of red, green and blue color coordinate loci of the white light which are within a chrominance error range (±4ΔE*ab) locus from the constant hue locus of sRGB color coordinates, or within a chrominance error range (±4ΔE*ab) locus from the constant hue locus of AdobeRGB color coordinates include the red color coordinate locus.

5. The back light unit of claim 1, wherein each of the red, green and blue color coordinate loci of the white light are within a chrominance error range (±4ΔE*ab) locus from the constant hue locus of sRGB color coordinates, or within a chrominance error range (±4ΔE*ab) locus from the constant hue locus of AdobeRGB color coordinates.

6. The back light unit of claim 1, wherein
the light emitting diode light source has a light emitting peak wavelength from about 430 nanometers to about 470 nanometers, and
the semiconductor nanocrystals comprise:
a green light emitting semiconductor nanocrystal having a light emitting peak wavelength from about 510 nanometers to about 560 nanometers, and
a red semiconductor nanocrystal having a light emitting peak wavelength from about 600 nanometers to about 650 nanometers, and
the green and red light emitting semiconductor nanocrystals have full width at half maximums of a light emitting peak of about 60 nanometers or less.

7. The back light unit of claim 6, wherein full width at half maximums of the light emitting peaks of the green and red light emitting semiconductor nanocrystals are about 40 nanometers or less.

8. The back light unit of claim 6, wherein a ratio (S/(AG)) of an overlapping area (S) to a total area (AG) of the light emitting spectrum of the green light emitting semiconductor nanocrystal, or a ratio (S/(AR)) of an overlapping area (S) to a total area (AR) of the light emitting spectrum of the red light emitting semiconductor nanocrystal is about 15% or less.

9. The back light unit of claim 1, wherein
the light emitting diode light source has a light emitting peak wavelength from about 440 nanometers to about 460 nanometers, and
the semiconductor nanocrystals comprise:
a green light emitting semiconductor nanocrystal having a light emitting peak wavelength from about 530 nanometers to about 550 nanometers, and
a red semiconductor nanocrystal having a light emitting peak wavelength from about 620 nanometers to about 640 nanometers.

10. The back light unit of claim 1, wherein
the light emitting intensity of the light emitting diode light source is about 0.43±0.05,
the semiconductor nanocrystals comprise a green light emitting semiconductor nanocrystal and a red semiconductor nanocrystal,
the light emitting intensity of the green light emitting semiconductor nanocrystal is about 0.27±0.05, and
the light emitting intensity of the red light emitting semiconductor nanocrystal is about 0.28±0.05.

11. The back light unit of claim 1, wherein the light conversion layer is separately disposed from the light emitting diode light source.

12. The back light unit of claim 11, wherein the light conversion layer comprises a green light layer having a green light emitting semiconductor nanocrystal and a red light layer having a red light emitting semiconductor nano crystal.

13. A light emitting device comprising:
a light emitting diode light source; and
a light conversion layer which converts a first light from the light emitting diode light source into a second light,
wherein at least two of red, green and blue color coordinate loci of the second light are within a chrominance error range (±4ΔE*ab) locus from the constant hue locus of sRGB color coordinates, or within a chrominance error range (±4ΔE*ab) locus from the constant hue locus of AdobeRGB color coordinates,
wherein the light conversion layer comprises semiconductor nanocrystals.

14. The light emitting device of claim 13, wherein the at least two of red, green and blue color coordinate loci of the second light are within a chrominance error range (±2ΔE*ab) locus from the constant hue locus of sRGB color coordinates, or within a chrominance error range (±2ΔE*ab) locus from the constant hue locus of AdobeRGB color coordinates.

15. The light emitting device of claim 13, wherein the at least two of red, green and blue color coordinate loci of the second light which are within a chrominance error range (±4ΔE*ab) locus from the constant hue locus of sRGB color coordinates, or within a chrominance error range (±4ΔE*ab) locus from the constant hue locus of AdobeRGB color coordinates include the blue color coordinate locus.

16. The light emitting device of claim 15, wherein the at least two of red, green and blue color coordinate loci of the second light which are within a chrominance error range (±4ΔE*ab) locus from the constant hue locus of sRGB color coordinates, or within a chrominance error range (±4ΔE*ab) locus from the constant hue locus of AdobeRGB color coordinates include the red color coordinate locus.

17. The light emitting device of claim 13, wherein each of the red, green and blue color coordinate loci of the second light are within a chrominance error range (±4ΔE*ab) locus from the constant hue locus of sRGB color coordinates, or within a chrominance error range (±4ΔE*ab) locus from the constant hue locus of AdobeRGB color coordinates.

18. The light emitting device of claim 13, wherein
the light emitting diode light source has a light emitting peak wavelength from about 430 nanometers to about 470 nanometers, and
the semiconductor nanocrystals comprise:
a green light emitting semiconductor nanocrystal having a light emitting peak wavelength from about 510 nanometers to about 560 nanometers, and
a red semiconductor nanocrystal having a light emitting peak wavelength from about 600 nanometers to about 650 nanometers, and
the green and red light emitting semiconductor nanocrystals have full width at half maximums of a light emitting peak of about 60 nanometers or less.

19. The light emitting device of claim 18, wherein full width at half maximums of the light emitting peaks of the green and red light emitting semiconductor nanocrystals are about 40 nanometers or less.

20. The light emitting device of claim 18, wherein a ratio (S/(AG)) of an overlapping area (S) to a total area (AG) of the light emitting spectrum of the green light emitting semiconductor nano crystal, or a ratio (S/(AR)) of an overlapping area (S) to a total area (AR) of the light emitting spectrum of the red light emitting semiconductor nanocrystal is about 15% or less.

21. The light emitting device of claim 13, wherein
the light emitting diode light source has a light emitting peak wavelength from about 440 nanometers to about 460 nanometers, and
the semiconductor nanocrystals comprise:
a green light emitting semiconductor nanocrystal having a light emitting peak wavelength from about 530 nanometers to about 550 nanometers, and
a red semiconductor nanocrystal having a light emitting peak wavelength from about 620 nanometers to about 640 nanometers.

22. The light emitting device of claim 13, wherein
the light emitting intensity of the light emitting diode light source is about 0.43±0.05,
the semiconductor nanocrystals comprise a green light emitting semiconductor nanocrystal and a red semiconductor nanocrystal,
the light emitting intensity of the green light emitting semiconductor nanocrystal is about 0.27±0.05, and
the light emitting intensity of the red light emitting semiconductor nanocrystal is about 0.28±0.05.

23. The light emitting device of claim 13, wherein the light conversion layer is separately disposed from the light emitting diode light source.

24. The light emitting device of claim 23, wherein the light conversion layer comprises a green light layer having a green light emitting semiconductor nanocrystal and a red light layer having a red light emitting semiconductor nano crystal.

25. A liquid crystal display comprising:
a light emitting diode light source; and
a light conversion layer which converts incident light from the light emitting diode light source into white light,
wherein at least two of red, green and blue color coordinate loci of the white light are within a chrominance error range (±4ΔE*ab) locus from the constant hue locus of sRGB color coordinates, or within a chrominance error range (±4ΔE*ab) locus from the constant hue locus of AdobeRGB color coordinates,
wherein the light conversion layer comprises semiconductor nanocrystals.

26. The liquid crystal display of claim 25, wherein the at least two of red, green and blue color coordinate loci of the white light are within a chrominance error range (±2ΔE*ab) locus from the constant hue locus of sRGB color coordinates, or within a chrominance error range (±2ΔE*ab) locus from the constant hue locus of AdobeRGB color coordinates.

27. The liquid crystal display of claim 25, wherein the at least two of red, green and blue color coordinate loci of the white light which are within a chrominance error range (±4ΔE*ab) locus from the constant hue locus of sRGB color coordinates, or within a chrominance error range (±4ΔE*ab) locus from the constant hue locus of AdobeRGB color coordinates include the blue color coordinate locus.

28. The liquid crystal display of claim 27, wherein the at least two of red, green and blue color coordinate loci of the white light which are within a chrominance error range (±4ΔE*ab) locus from the constant hue locus of sRGB color coordinates, or within a chrominance error range (±4ΔE*ab) locus from the constant hue locus of AdobeRGB color coordinates include the red color coordinate locus.

29. The liquid crystal display of claim 25, wherein each of the red, green and blue color coordinate loci of the white light are within a chrominance error range (±4ΔE*ab) locus from the constant hue locus of sRGB color coordinates, or within a chrominance error range (±4ΔE*ab) locus from the constant hue locus of AdobeRGB color coordinates.

30. The liquid crystal display of claim 25, wherein
the light emitting diode light source has a light emitting peak wavelength from about 430 nanometers to about 470 nanometers, and
the semiconductor nanocrystals comprise:
a green light emitting semiconductor nanocrystal having a light emitting peak wavelength from about 510 nanometers to about 560 nanometers, and
a red semiconductor nanocrystal having a light emitting peak wavelength from about 600 nanometers to about 650 nanometers, and
the green and red light emitting semiconductor nanocrystals have full width at half maximums of a light emitting peak of about 60 nanometers or less.

31. The liquid crystal display of claim 30, wherein full width at half maximums of the light emitting peaks of the green and red light emitting semiconductor nanocrystals are about 40 nanometers or less.

32. The liquid crystal display of claim 30, wherein a ratio (S/(AG)) of an overlapping area (S) to a total area (AG) of the light emitting spectrum of the green light emitting semiconductor nano crystal, or a ratio (S/(AR)) of an overlapping area (S) to a total area (AR) of the light emitting spectrum of the red light emitting semiconductor nanocrystal is about 15% or less.

33. The liquid crystal display of claim 25, wherein
the light emitting diode light source has a light emitting peak wavelength from about 440 nanometers to about 460 nanometers, and
the semiconductor nanocrystals comprise:
a green light emitting semiconductor nanocrystal having a light emitting peak wavelength from about 530 nanometers to about 550 nanometers, and
a red semiconductor nanocrystal having a light emitting peak wavelength from about 620 nanometers to about 640 nanometers.

34. The liquid crystal display of claim 25, wherein
the light emitting intensity of the light emitting diode light source is about 0.43±0.05,
the semiconductor nanocrystals comprise a green light emitting semiconductor nanocrystal and a red semiconductor nanocrystal,
the light emitting intensity of the green light emitting semiconductor nanocrystal is about 0.27±0.05, and
the light emitting intensity of the red light emitting semiconductor nanocrystal is about 0.28±0.05.

35. The liquid crystal display of claim 25, wherein the light conversion layer is separately disposed from the light emitting diode light source.

36. The liquid crystal display of claim 35, wherein the light conversion layer comprises a green light layer having a green light emitting semiconductor nanocrystal and a red light layer having a red light emitting semiconductor nano crystal.

37. The liquid crystal display of claim 25, further comprising a plurality of color filters.

38. The liquid crystal display of claim 37, wherein the color filters comprise a red color filter, a green color filter, and a blue color filter.

* * * * *